US006599766B1

(12) United States Patent
Tabery et al.

(10) Patent No.: US 6,599,766 B1
(45) Date of Patent: Jul. 29, 2003

(54) METHOD FOR DETERMINING AN ANTI REFLECTIVE COATING THICKNESS FOR PATTERNING A THIN FILM SEMICONDUCTOR LAYER

(75) Inventors: Cyrus E. Tabery, Cupertino, CA (US); Chih-Yuh Yang, San Jose, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/093,596

(22) Filed: Mar. 8, 2002

Related U.S. Application Data
(60) Provisional application No. 60/344,141, filed on Dec. 28, 2001.

(51) Int. Cl.[7] ............................................... H01L 21/00
(52) U.S. Cl. ......................................................... 438/16
(58) Field of Search .............................. 438/16, 14, 72, 438/636, 952

(56) References Cited

U.S. PATENT DOCUMENTS

| | | | |
|---|---|---|---|
| 6,030,717 A | * | 2/2000 | Nakamura et al. .......... 428/699 |
| 6,235,456 B1 | | 5/2001 | Ibok |
| 6,258,734 B1 | | 7/2001 | Yao et al. |

OTHER PUBLICATIONS

Puligadda, R. et al. "New fast bottom antireflective coatings for 248 nm lithography" Proceedings of the SPIE (USA) vol. 4345, pt. 1–2, p. 892–837, 2001 (conference date Feb. 26–28, 2001).*

* cited by examiner

Primary Examiner—Craig Thompson
(74) Attorney, Agent, or Firm—Renner, Otto, Boisselle & Sklar

(57) ABSTRACT

The invention provides a method of selecting an anti reflective layer thickness for patterning a thin film silicon gate layer over a high K dielectric layer. The method comprises selecting a trial anti reflective layer thickness. A first coherent illumination intensity reflected from an interface between the photoresist layer and the anti reflective layer is calculated at the lithography wavelength. A second coherent illumination intensity reflected from an interface between the anti reflective layer and the polysilicon layer is calculated at the lithography wavelength. And, a third coherent illumination intensity reflected from an interface between the polysilicon layer and the high K dielectric layer is calculated at the lithography wavelength. A total coherent illumination intensity that comprises the sum of the first coherent illumination intensity, the second coherent illumination intensity, and the third coherent illumination intensity is calculated and compared to a predetermined threshold. If below the threshold, the trail anti reflective layer thickness is selected as the anti reflective layer thickness.

16 Claims, 5 Drawing Sheets

$$I_1 = I_0 \, (R_{Pr/BARC}) \, \sin(WT + \pi)$$

FIG. 2a

$$I_2 = I_0 \, (T_{Pr/BARC})^2 \, (R_{BARC/Poly}) \, A^2_{BARC} \, \sin(WT + 2\phi_{BARC} + \pi)$$

FIG. 2b

$$I_3 = I_0 \, (T_{Pr/BARC})^2 \, (T_{BARC/Poly})^2 \, (R_{Poly/HK}) \, A^2_{BARC} \, A^2_{Poly} \, \sin(WT + 2\phi_{BARC} + 2\phi_{poly} + \pi)$$

FIG. 2c

$$I_4 = I_0 \, (T_{Pr/BARC})^2 \, (T_{BARC/poly})^2 \, (T_{poly/HK})^2 \, (R_{HK/sub}) \, A^2_{BARC} \, A^2_{Poly} \, A^2_{HK} \, \sin(WT + 2\phi_{BARC} + 2\phi_{poly} + 2\phi_{HK} + \pi)$$

FIG. 2d

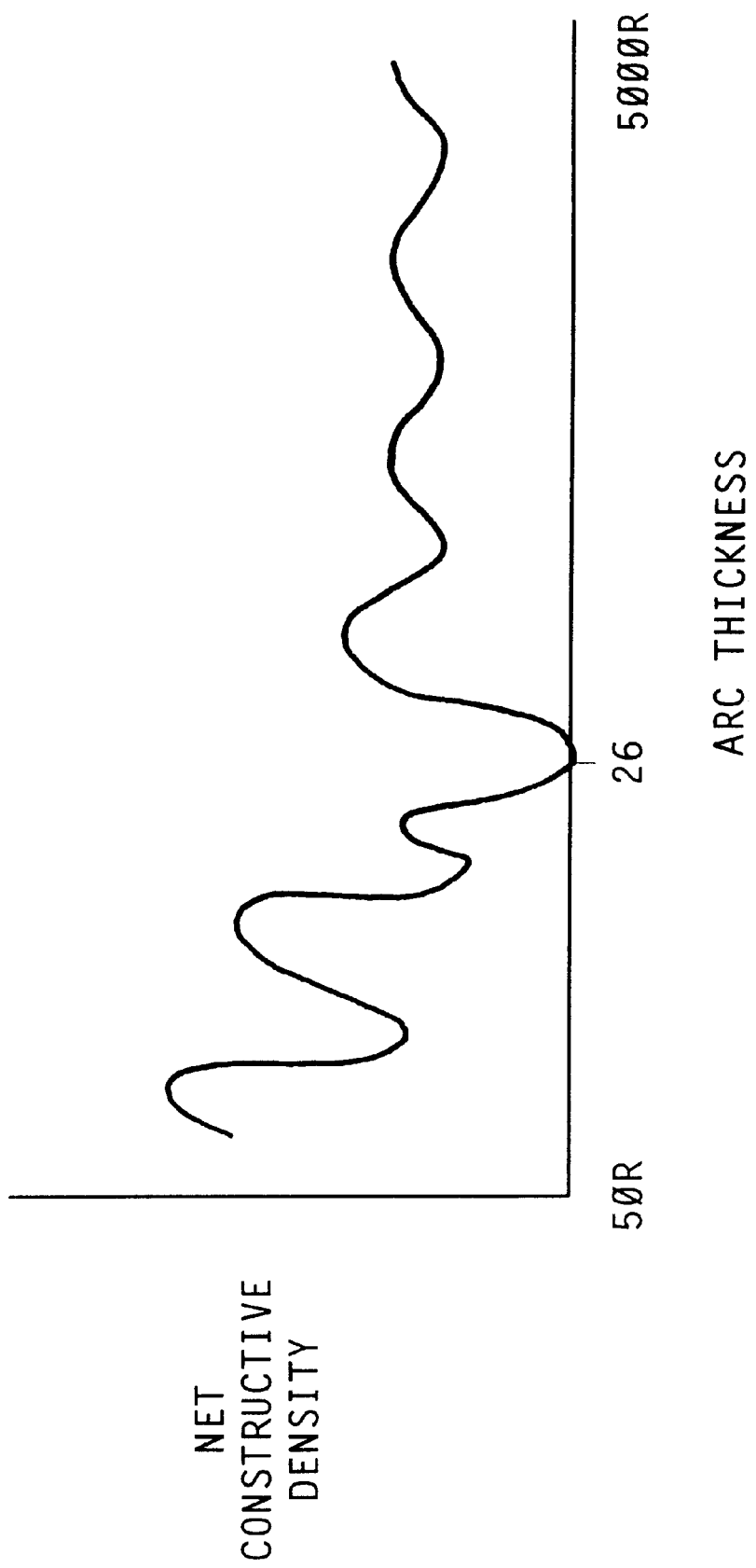

METHOD FOR DETERMINING AN ANTI REFLECTIVE COATING THICKNESS FOR PATTERNING A THIN FILM SEMICONDUCTOR LAYER

This application claims the benefit of provisional application Ser. No. 60/344,141, filed Dec. 28, 2001.

TECHNICAL FIELD

The present invention relates methods for fabricating a bottom anti reflective coating on semiconductors, and more specifically to determining an anti reflective coating thickness for patterning a thin film semiconductor layer over a high K dielectric layer.

BACKGROUND OF THE INVENTION

Many silicon devices used in modern integrated circuits utilize a field effect structure that comprises a polysilicon gate positioned over a channel region within a silicon substrate. The gate is separated from the channel region by a dielectric material such as silicon dioxide.

Such a transistor is typically fabricated using lithography techniques that include first growing the silicon dioxide on the surface of the substrate, depositing a polysilicon gate layer over the silicon dioxide, depositing an anti reflective coating over the surface of the polysilicon gate layer, depositing a photoresist layer over the anti reflective coating, exposing the photoresist layer using patterned coherent illumination, developing the photoresist to form a mask, and etching the anti reflective coating and the polysilicon layer to form the gate.

Without the anti reflective coating, the interface between the polysilicon and the photoresist would reflect the patterned illumination and degrade the contrast of the patterned illumination and thereby degrade the precision of the mask and the edge profile of the gate subsequently formed in the polysilicon layer. The anti reflective coating typically absorbs illumination at the lithography wavelength and thereby prevents reflection from the interface of the antireflective coating and the polysilicon layer from degrading the precision of the mask.

Generally the thickness of the silicon layer and the anti reflective properties of the silicon dioxide eliminate any need to consider reflected lithography illumination from the interface of the silicon layer and the silicon dioxide layer.

However, as the size of transistor structures are decreased, there is a trend to decrease the thickness of the silicon gate and to replace the silicon dioxide with other dielectric materials with a dielectric constant greater than that of silicon dioxide. Such thin film silicon layers and high k dielectrics tend to increase the intensity of illumination reflected from the interface between the silicon and the high k dielectric.

Accordingly there is a strong need in the art for a method of fabricating a transistor using an anti reflective coating that is useful with a very thin polysilicon gate layer positioned over a dielectric material with a high dielectric constant.

SUMMARY OF THE INVENTION

A first aspect of the present invention is to provide a method of selecting an anti reflective layer thickness for placement between a photoresist layer to be patterned and a polysilicon layer for a device with a high K dielectric layer below the polysilicon layer. The method comprises selecting a trial anti reflective layer thickness and calculating if the trail anti reflective layer thickness will give a total reflected coherent illumination intensity below a predetermined threshold that is low enough to provide sharp contrast when exposing a photoresist. Calculating the total reflected coherent illumination intensity comprises: a) determining a first coherent illumination intensity reflected from an interface between the photoresist layer and the anti reflective layer; b) determining a second coherent illumination intensity reflected from an interface between the anti reflective layer and the polysilicon layer; c) determining a third coherent illumination intensity reflected from an interface between the polysilicon layer and the high K dielectric layer; d) determining a fourth coherent illumination intensity reflected from an interface between the high K dielectric layer and a base substrate below the high K dielectric layer; and e) determining a total reflected coherent illumination intensity that comprises the sum of the first coherent illumination intensity, the second coherent illumination intensity, the third coherent illumination intensity, and the fourth coherent illumination intensity. The trail anti reflective layer thickness as the anti reflective layer thickness if the total coherent illumination intensity is below the predetermined threshold.

The first coherent illumination intensity is equal the intensity of coherent illumination incident on the interface between the photoresist layer and the anti reflective layer multiplied by a first reflection coefficient and phase shifted by Π radians. The first reflection coefficient is equal to the quotient of the difference between the absolute index of refraction of the photoresist layer and the absolute index of refraction of the anti reflection layer divided by the sum of the absolute index of refraction of the photoresist layer and the absolute index of refraction of the anti reflection layer.

The second coherent illumination intensity is equal the intensity of coherent illumination incident on the interface between the photoresist layer and the anti reflective layer that is phase shifted by Π radians plus a phase equal to twice a phase shift that occurs by transmission through the anti reflective layer and the intensity is multiplied by: a) a fraction of illumination transmitted through the anti reflective layer squared, b) a first transmission coefficient squared, and c) a second reflection coefficient.

The first transmission coefficient is equal to the quotient of 4 multiplied by the absolute index of refraction of the photoresist layer multiplied by the absolute index of refraction of the anti reflection layer divided by the square of the sum of the absolute index of refraction of the photoresist layer and the absolute index of refraction of the anti reflection layer. The second reflection coefficient is equal to the quotient of the difference between the absolute index of refraction of the anti reflection layer and the absolute index of refraction of the polysilicon layer divided by the sum of the absolute index of refraction of the anti reflection layer and the absolute index of refraction of the polysilicon layer.

The third coherent illumination intensity is equal the intensity of coherent illumination incident on the interface between the photoresist layer and the anti reflective layer that is phase shifted by Π radians plus a phase equal to twice a phase shift that occurs by transmission through the anti reflective layer plus twice a phase shift that occurs by transmission through the silicon gate layer, and, multiplied by: a) a fraction of illumination transmitted through the anti reflective layer squared, b) a fraction of illumination transmitted through the silicon gate layer squared, c) the first transmission coefficient squared, d) a second transmission coefficient squared, and d) a third reflection coefficient.

The second transmission coefficient is equal to the quotient of 4 multiplied by the absolute index of refraction of the anti reflection layer multiplied by the absolute index of refraction of the silicon gate layer divided by the square of the sum of the absolute index of refraction of the anti reflection layer and the absolute index of refraction of the silicon gate layer. The third reflection coefficient is equal to the quotient of the difference between the absolute index of refraction of the silicon gate layer and the absolute index of refraction of the high K dielectric divided by the sum of the absolute index of refraction of the silicon gate layer and the absolute index of refraction of the high K dielectric.

The fourth coherent illumination intensity is equal the intensity of coherent illumination incident on the interface between the photoresist layer and the anti reflective layer that is phase shifted by Π radians plus a phase equal to twice a phase shift that occurs by transmission through the anti reflective layer, twice a phase shift that occurs by transmission through the silicon gate layer, and twice a phase shift through the high K dielectric layer; and multiplied by: a) a fraction of illumination transmitted through the anti reflective layer squared, b) a fraction of illumination transmitted through the silicon gate layer squared, c) a fraction of illumination transmitted through the high K dielectric layer, d) the first transmission coefficient squared, e) the second transmission coefficient squared, and f) a fourth reflection coefficient.

The third transmission coefficient is equal to the quotient of 4 multiplied by the absolute index of refraction of the polysilicon layer multiplied by the absolute index of refraction of the high K dielectric layer divided by the square of the sum of the absolute index of refraction of the polysilicon layer and the absolute index of refraction of the high K dielectric layer. The fourth reflection coefficient is equal to the quotient of the difference between the absolute index of refraction of the high K dielectric layer and the absolute index of refraction of the substrate divided by the sum of the absolute index of refraction of the high K dielectric layer and the absolute index of refraction of the substrate.

For a better understanding of the present invention, together with other and further aspects thereof, reference is made to the following description, taken in conjunction with the accompanying drawings, and its scope will be pointed out in the appended claims.

BRIEF DESCRIPTION OF THE DRAWINGS

FIG. 2a is a graphic representation of an equation for calculating the intensity of reflected coherent illumination from an interface of the substrate of FIG. 1;

FIG. 2b is a graphic representation of an equation for calculating the intensity of reflected coherent illumination from an interface of the substrate of FIG. 1;

FIG. 2c is a graphic representation of an equation for calculating the intensity of reflected coherent illumination from an interface of the substrate of FIG. 1;

FIG. 2d is a graphic representation of an equation for calculating the intensity of reflected coherent illumination from an interface of the substrate of FIG. 1;

FIG. 3 is a graphic representation of net coherent illumination reflected from certain interfaces of the substrate of FIG. 1;

DESCRIPTION OF THE PREFERRED EMBODIMENTS

The present invention will now be described in detail with reference to the drawings. The diagrams are not drawn to scale and the dimensions of some features are intentionally drawn larger than scale for purposes of showing clarity.

Figure 1:
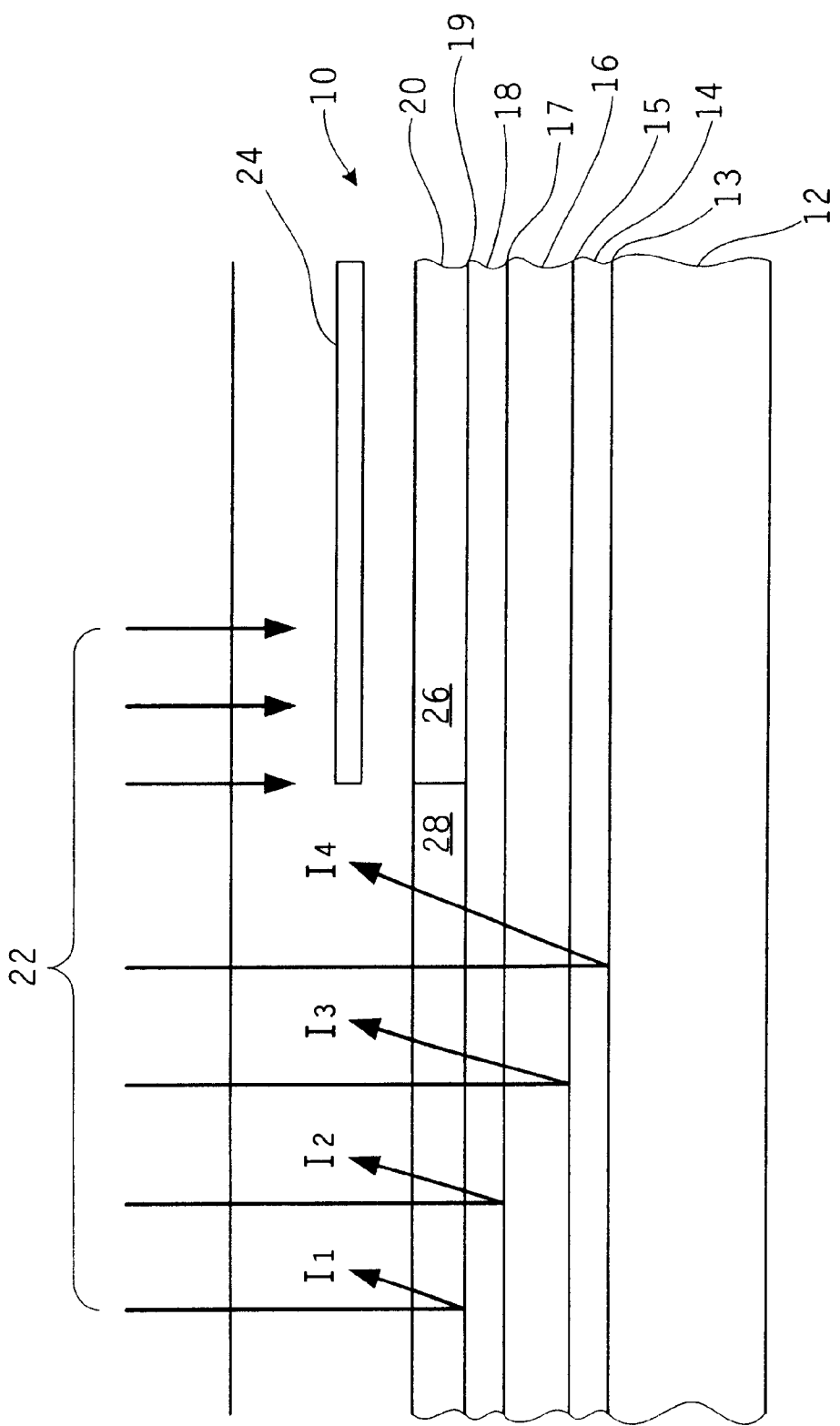
FIG. 1 is a schematic, cross sectional view of a substrate that includes a thin film semiconductor layer positioned over a high k dielectric material.

Referring to FIG. 1, an exemplary wafer 10 is shown. The wafer 10 includes a base substrate 12. On the surface of the base substrate 12 is a high k dielectric layer 14, a thin film polysilicon layer 16, a bottom anti reflective coating (BARC) layer 18, and a photoresist layer 20. In the exemplary embodiment, the thickness of the polysilicon layer 16, the dielectric material comprising the dielectric layer 14, and the thickness of the dielectric layer are selected to optimize operation of a field effect transistor that is to be fabricated on the wafer 10 using the methods of this invention. The dielectric material may comprise a material selected from the group of $HfO_2$, $ZrO_2$, $CeO_2$, $Al_2O_3$, $TiO_2$, $Y_2O_3$, and other binary and tertiary metal oxides and ferroelectric material having a dielectric constant greater than 20. The material comprising the BARC layer 18 material may be an organic or inorganic material that provides a substantially non-reflective interface 19 between the BARC layer 18 and the polysilicon layer 16.

The process for fabricating the field effect transistor on the wafer 10 comprises patterning the photoresist layer 20, developing the photoresist layer 20 to form a mask over a masked portion of the BARC layer 18 and to expose an unmasked portion of the BARC layer 18. Patterning the photoresist layer 20 comprises illuminating only a portion 28 of the photoresist layer 20 (such as the masked portion) with patterned coherent illumination 22 at a lithography wavelength that does not illuminate another portion 26 (such as the unmasked region). Typically a patterned reticle 24 is used to provide sharp contrast between the illuminated portion 28 and the non illuminated portion 26. To provide sharp contrast, illumination $I_1$ reflected from the interface 19 between the photoresist layer 20 and the BARC layer 18, illumination $I_2$ reflected from the interface 17 between the BARC layer 18 and the polysilicon layer 16, illumination $I_3$ reflected from the interface 15 between the polysilicon layer 16 and the dielectric layer 14, and illumination $I_4$ reflected from the interface 13 between the dielectric layer 14 and the base substrate 12 must not expose the non illuminated portion 26 of the wafer 10.

Turning to FIG. 2a in conjunction with FIG. 1, the intensity of coherent reflected illumination $I_1$ is a function of the intensity of the illumination incident on the interface 19, the portion of illumination reflected by interface 19 ($R_{Pr/BARC}$), and the phase of the incident illumination shifted by Π radians. The portion of illumination reflected by the interface 19 is equal to the quotient of the difference between the index of refraction of the two materials comprising the interface 19 divided by the sum of the index of refractions.

$$R_{Pr/BARC} = \frac{(n_{Pr} - n_{BARC})}{(n_{Pr} + n_{BARC})}$$

Stated more specifically, the intensity of reflected coherent illumination $I_1$ is the product of the intensity of the illumination incident on the interface 19, $R_{Pr/BARC}$, and the SIN of the incident wave form (wt) phase shifted by Π radians.

Turning to FIG. 2b in conjunction with FIG. 1, the intensity of reflected coherent illumination $I_2$ is a function of the intensity of the illumination incident on the interface 19, the portion of illumination transmitted by interface 19 ($T_{Pr/BARC}$), the portion of illumination reflected by interface 17 ($R_{BARC/Poly}$), the portion of illumination that is transmitted (unabsorbed) by the BARC layer 18, and the phase of the incident illumination shifted by transmission through the BARC layer 18 and by Π radians. The portion of illumination transmitted by the interface 19 is equal to four times the product of the index of refraction of the two materials comprising the interface 19 divided by the square of the sum of the index of refraction of the two materials comprising the interface 19.

$$T_{Pr/BARC} = \frac{4n_{Pr} n_{BARC}}{(n_{Pr} + n_{BARC})^2}$$

The portion of illumination transmitted through the BARC layer 18 is equal to:

$$A_{BARC} = 2e^{-(\text{absorption coefficient})(\text{thickness})}$$

Stated more specifically, the intensity of coherent reflected illumination $I_2$ is the product of the intensity of the illumination incident on the interface 19, $T^2_{Pr/BARC}$, $R_{BARC/Poly}$, $A^2_{BARC}$, and the SIN of the phase of the incident waveform (wt) phase shifted by twice the phase shift through the BARC layer 18 and by Π radians.

Turning to FIG. 2c in conjunction with FIG. 1, the intensity of coherent reflected illumination $I_3$ is a function of the intensity of the illumination incident on the interface 19, the portion of illumination transmitted by interface 19 ($T_{Pr/BARC}$), the portion of illumination transmitted by interface 17 ($T_{BARC/Poly}$), the portion of illumination reflected by interface 15 ($R_{Poly/HK}$), the portion of illumination that is transmitted (unabsorbed) by the BARC layer 18, the portion of the illumination that is transmitted by the polysilicon layer 16, and the phase of the incident illumination shifted by transmission through the BARC layer 18, the polysilicon layer 16, and by Π radians upon reflection from interface 15.

Stated more specifically, the intensity of coherent reflected illumination $I_3$ is the product of the intensity of the illumination incident on the interface 19, $T^2_{Pr/BARC}$, $T^2_{BARC/Poly}$, $R_{Poly/HK}$, $A^2_{BARC}$, $A^2_{Poly}$, and the SIN of the phase of the incident waveform phase shifted by twice the phase shift through the BARC layer 18, twice the phase shift through the poly layer 16, and Π radians.

Turning to FIG. 2d in conjunction with FIG. 1, the intensity of coherent reflected illumination $I_4$ is a function of the intensity of the illumination incident on the interface 19, the portion of illumination transmitted by interface 19 ($T_{Pr/BARC}$), the portion of illumination transmitted by interface 17 ($T_{BARC/Poly}$), the portion of illumination transmitted by interface 15 ($T_{Poly/HK}$), the portion of illumination reflected by interface 13 ($R_{HK/Sub}$), the portion of illumination that is transmitted (unabsorbed) by the BARC layer 18, the portion of the illumination that is transmitted by the polysilicon layer 16, the portion of the illumination that is transmitted by the dielectric layer 14, and the phase of the incident illumination shifted by transmission through the BARC layer 18, the polysilicon layer 16, the dielectric layer 14, and by Π radians upon reflection from interface 13.

Stated more specifically, the intensity of coherent reflected illumination 13 is the product of the intensity of the illumination incident on the interface 19, $T^2_{Pr/BARC}$, $T^2_{BARC/Poly}$, $T^2_{Poly/HK}$, $R_{HK/Sub}$, $A^2_{BARC}$, $A^2_{Poly}$, $A^2_{HK}$, and the SIN of the phase of the incident waveform phase shifted by twice the phase shift through the BARC layer 18, twice the phase shift through the poly layer 16, twice the phase shift through the dielectric layer 14, and Π radians.

The best contrast between the illumination portion 28 and the non illumination portion 26 occurs when the sum of the reflected illumination ($I_1$, $I_2$, $I_3$, plus $I_4$) is equal to zero. Further, the thickness of the polysilicon layer 16, the high K material making up the dielectric layer 14, the thickness of the dielectric layer 14, and the material making up the substrate 12 are typically determined by device performance characteristics. However, the material making up the BARC layer 14 and the thickness of the BARC layer 14 may be selected to provide for the sum of the reflected illumination to be minimal or zero.

FIG. 3 represents a graph that shows the sum of reflected illumination (Y axis) as a function of changing the thickness of the BARC layer 14. The thickness 26 provides for the smallest sum of reflected illumination. As the thickness of BARC layer 14 increases, the intensity of $I_2$, $I_3$, and $I_4$ decrease and the sum approaches the value of $I_1$.

Figure 4A:
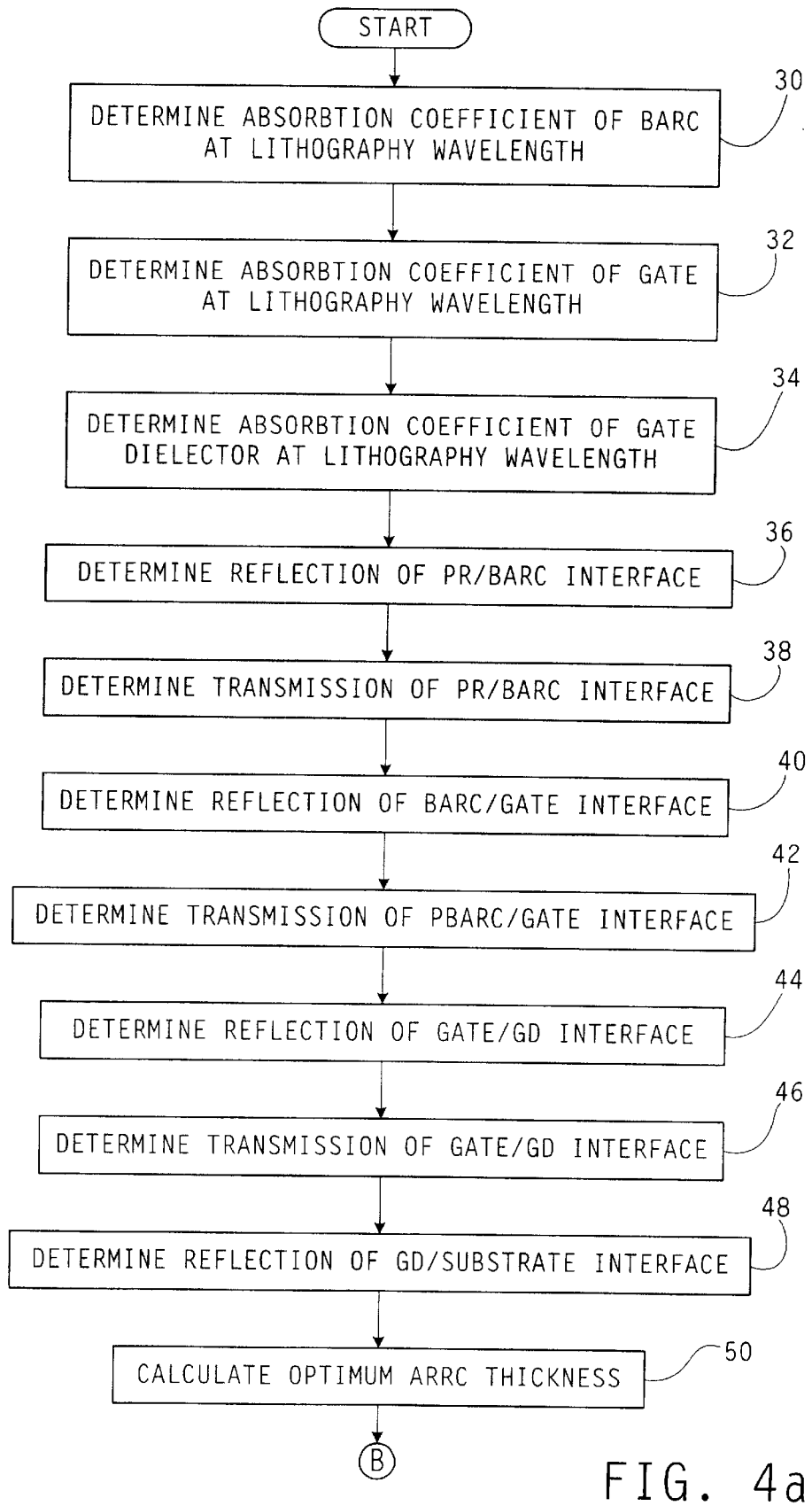
FIG. 4a is a flow chart representing steps for determining an anti reflective coating thickness for patterning a gate on the substrate of FIG. 1.
Figure 4B:
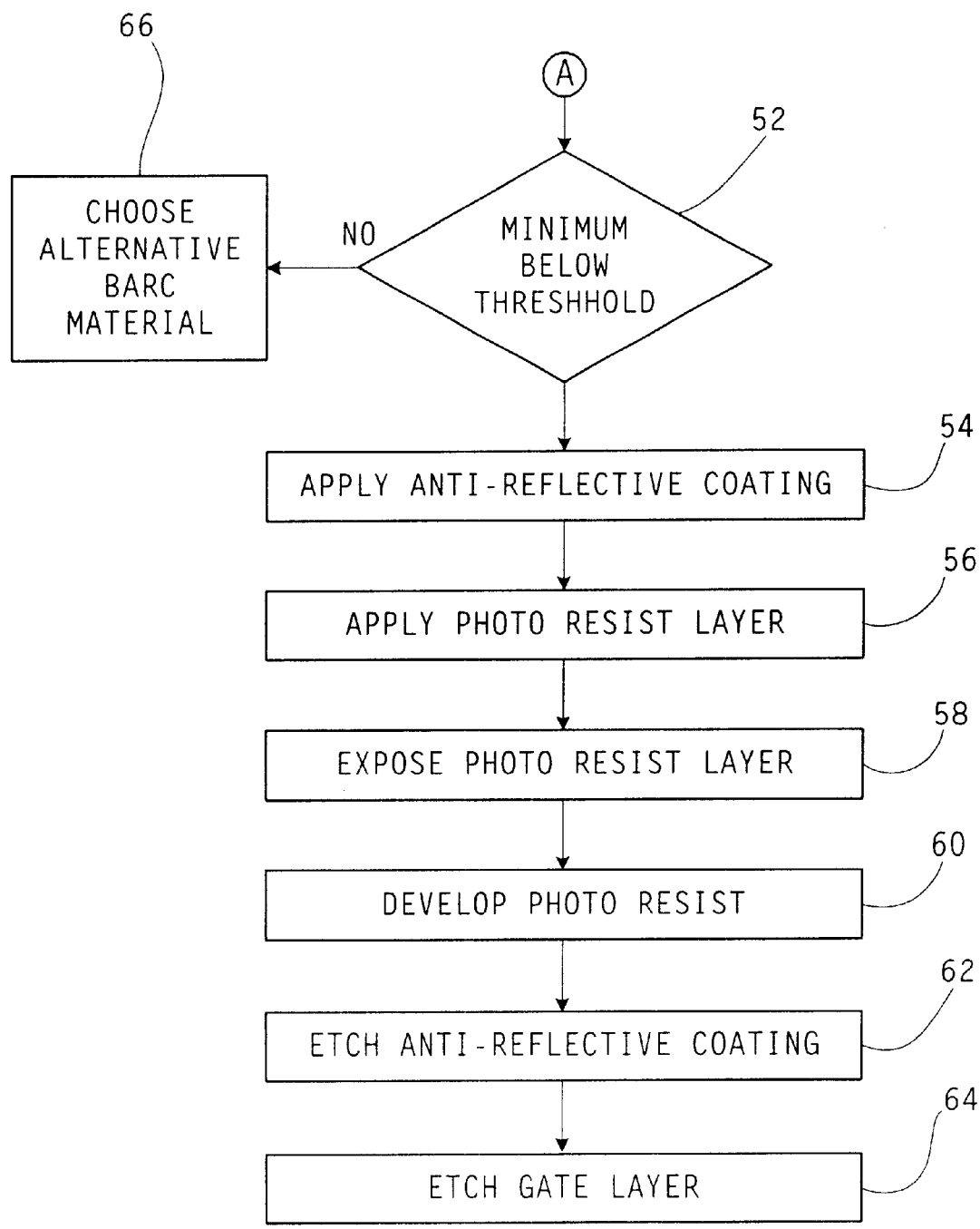
FIG. 4b is a flow chart representing steps for determining an anti reflective coating thickness for patterning a gate on the substrate of FIG. 1.

FIG. 4a shows a flow chart that represents processing steps for fabricating a gate on a thin film polysilicon layer 16. Steps 30, 32, and 34 represent determining the absorption coefficient of each of the BARC layer 18, the polysilicon layer 16, and the dielectric layer 14 respectively. The absorption coefficient is a property of the material and can be determined by measurement or reliance on published information related to the material.

Steps 36 and 38 represent determining the reflection (R) and the transmission (T) of illumination through the interface 19, steps 40 and 42 represent determining the reflection (R) and transmission (T) through the interface 17, steps 44 and 46 represent determining the reflection (R) and transmission (T) through the interface 15 and step 48 represents determining the reflection (R) by the interface 13.

Step 50 represents calculating the optimum thickness of the BARC layer 18 that provides for the sum of the reflected illumination ($I_1$, $I_2$, $I_3$, plus $I_4$) to be a minimum using the equations set forth in FIGS. 2a–2d. Step 52 represents comparing the sum of the reflected illumination at the optimum thickness of the BARC layer 18 to a predetermined threshold that is low enough to provide for a sharp contrast between the illuminated region 28 and the non illuminated region 26. If not below the predetermined threshold, the a new BARC layer 18 material is selected at step 66 and the process is repeated with the new BARC layer 18 material.

If the sum of the reflected illumination is below threshold at step 52, step 54 represents applying the anti reflective coating (e.g the BARC layer 18) to the surface of the polysilicon layer 16.

Step 56 represents applying the photoresist layer 20 over the BARC layer 18. The photoresist material may be a photoresist material that corresponds to the lithography wave length. Both 193 nm or a 248 nm photoresists support patterning of a developed image critical dimension on the order of 90 nm to 180 nm. Such a critical dimension is appropriate for very small transistor devices. The thickness of the photoresist layer 20 is dependent upon the optical properties of the photoresist material. In an exemplary embodiment, a 248 nm photoresist would be deposited to a thickness of between 1500A and 5000A or, for a more narrow range, a thickness of between 2000A and 4000A. In the exemplary embodiment, a 193 nm photoresist would be deposited to a thickness of between 1000A and 4500A, or, for a more narrow range, a thickness of between 2500A and 3500A.

Step 58 represents exposing the photoresist in the illumination portion 28 using coherent illumination at the lithography wavelength and step 60 represents developing the photoresist to leave a portion of the photoresist to mask the masked region of the BARC layer 18 and to expose the exposed region of the BARC layer 18.

Step 62 represents etching the BARC layer 18 and step 64 represents etching the polysilicon layer 16 in the exposed region to form the polysilicon gate.

Etching the BARC layer 18 may include an etch chemistry such as Cl in an inert gas environment such as argon. Etching the polysilicon layer 16 may include an ion bombardment etch using HBr and CL in combination with $HeO_2$ to increase the selectivity between the polysilicon and the high K material in the dielectric layer 14. Increasing the selectivity enables the etch to be performed with an increased bias power and a reduced pressure (than would be enabled without the $HeO_2$) without causing the etch to penetrate the dielectric layer 14. This increased bias power and reduced pressure improves the vertical tolerance of the gate side wall profile.

In summary, the processes for determining a thickness for an anti reflective coating of this invention provides for the ability to fabricate a smaller gate with an improved side wall tolerance. Although the methods have been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A method of selecting an anti reflective layer thickness for placement between a photoresist layer to be patterned and a polysilicon layer for a device with a high K dielectric layer below the polysilicon layer, the method comprising:

selecting a trial anti reflective layer thickness;

determining a first coherent illumination intensity reflected from an interface between the photoresist layer and the anti reflective layer;

determining a second coherent illumination intensity reflected from an interface between the anti reflective layer and the polysilicon layer;

determining a third coherent illumination intensity reflected from an interface between the polysilicon layer and the high K dielectric layer;

determining if a total coherent illumination intensity comprising the sum of the first coherent illumination intensity, the second coherent illumination intensity, and the third coherent illumination intensity is below a predetermined threshold;

selecting the trail anti reflective layer thickness as the anti reflective layer thickness if the total coherent illumination intensity is below the predetermined threshold.

2. The method of claim 1, wherein the first coherent illumination intensity is equal the intensity of coherent illumination incident on the interface between the photoresist layer and the anti reflective layer multiplied by a first reflection coefficient and phase shifted by Π radians, the first reflection coefficient being equal to the quotient of the difference between the absolute index of refraction of the photoresist layer and the absolute index of refraction of the anti reflection layer divided by the sum of the absolute index of refraction of the photoresist layer and the absolute index of refraction of the anti reflection layer.

3. The method of claim 2, wherein the second coherent illumination intensity is equal the intensity of coherent illumination incident on the interface between the photoresist layer and the anti reflective layer that is:

phase shifted by Π radians plus a phase equal to twice a phase shift that occurs by transmission through the anti reflective layer; and multiplied by:

a fraction of illumination transmitted through the anti reflective layer squared, a first transmission coefficient squared, the transmission coefficient being equal to the quotient of 4 multiplied by the absolute index of refraction of the photoresist layer multiplied by the absolute index of refraction of the anti reflection layer divided by the square of the sum of the absolute index of refraction of the photoresist layer and the absolute index of refraction of the anti reflection layer, and a second reflection coefficient, the second reflection coefficient being equal to the quotient of the difference between the absolute index of refraction of the anti reflection layer and the absolute index of refraction of the polysilicon layer divided by the sum of the absolute index of refraction of the anti reflection layer and the absolute index of refraction of the polysilicon layer.

4. The method of claim 3, wherein the third coherent illumination intensity is equal the intensity of coherent illumination incident on the interface between the photoresist layer and the anti reflective layer that is:

phase shifted by Π radians plus a phase equal to twice a phase shift that occurs by transmission through the anti reflective layer plus twice a phase shift that occurs by transmission through the silicon gate layer; and multiplied by:

a fraction of illumination transmitted through the anti reflective layer squared, a fraction of illumination transmitted through the silicon gate layer squared, the first transmission coefficient squared, a second transmission coefficient squared, the second transmission coefficient being equal to the quotient of 4 multiplied by the absolute index of refraction of the anti reflection layer multiplied by the absolute index of refraction of the silicon gate layer divided by the square of the sum of the absolute index of refraction of the anti reflection layer and the absolute index of refraction of the silicon gate layer, and a third reflection coefficient, the third reflection coefficient being equal to the quotient of the difference between the absolute index of refraction of the silicon gate layer and the absolute index of refraction of the high K dielectric divided by the sum of the absolute index of refraction of the silicon gate layer and the absolute index of refraction of the high K dielectric.

5. The method of claim 1, further including:

determining a fourth coherent illumination intensity reflected from an interface between the high K dielectric layer and a base substrate below the high K dielectric layer; and wherein the total coherent illumination intensity comprises the sum of the first coherent illumination intensity, the second coherent illumination intensity, the third coherent illumination intensity, and the fourth coherent illumination intensity.

6. The method of claim 5, wherein the first coherent illumination intensity is equal the intensity of coherent illumination incident on the interface between the photoresist layer and the anti reflective layer multiplied by a first reflection coefficient and phase shifted by Π radians, the first reflection coefficient being equal to the quotient of the difference between the absolute index of refraction of the photoresist layer and the absolute index of refraction of the anti reflection layer divided by the sum of the absolute index of refraction of the photoresist layer and the absolute index of refraction of the anti reflection layer.

7. The method of claim 6, wherein the second coherent illumination intensity is equal the intensity of coherent illumination incident on the interface between the photoresist layer and the anti reflective layer that is:

phase shifted by Π radians plus a phase equal to twice a phase shift that occurs by transmission through the anti reflective layer; and multiplied by:
a fraction of illumination transmitted through the anti reflective layer squared,
a first transmission coefficient squared, the transmission coefficient being equal to the quotient of 4 multiplied by the absolute index of refraction of the photoresist layer multiplied by the absolute index of refraction of the anti reflection layer divided by the square of the sum of the absolute index of refraction of the photoresist layer and the absolute index of refraction of the anti reflection layer, and
a second reflection coefficient, the second reflection coefficient being equal to the quotient of the difference between the absolute index of refraction of the anti reflection layer and the absolute index of refraction of the polysilicon layer divided by the sum of the absolute index of refraction of the anti reflection layer and the absolute index of refraction of the polysilicon layer.

8. The method of claim 7, wherein the third coherent illumination intensity is equal the intensity of coherent illumination incident on the interface between the photoresist layer and the anti reflective layer that is:

phase shifted by Π radians plus a phase equal to twice a phase shift that occurs by transmission through the anti reflective layer plus twice a phase shift that occurs by transmission through the silicon gate layer; and multiplied by:
a fraction of illumination transmitted through the anti reflective layer squared,
a fraction of illumination transmitted through the silicon gate layer squared,
the first transmission coefficient squared,
a second transmission coefficient squared, the second transmission coefficient being equal to the quotient of 4 multiplied by the absolute index of refraction of the anti reflection layer multiplied by the absolute index of refraction of the silicon gate layer divided by the square of the sum of the absolute index of refraction of the anti reflection layer and the absolute index of refraction of the silicon gate layer, and
a third reflection coefficient, the third reflection coefficient being equal to the quotient of the difference between the absolute index of refraction of the silicon gate layer and the absolute index of refraction of the high K dielectric divided by the sum of the absolute index of refraction of the silicon gate layer and the absolute index of refraction of the high K dielectric.

9. A method of patterning a thin film polysilicon layer with a high k dielectric positioned below the polysilicon layer, the method comprising:

applying an anti reflective layer to a surface of the gate layer, a thickness of the anti reflective layer being determined by a steps comprising:
selecting a trial anti reflective layer thickness;
determining a first coherent illumination intensity reflected from an interface between the photoresist layer and the anti reflective layer;
determining a second coherent illumination intensity reflected from an interface between the anti reflective layer and the polysilicon layer;
determining a third coherent illumination intensity reflected from an interface between the polysilicon layer and the high K dielectric layer;
determining if a total coherent illumination intensity comprising the sum of the first coherent illumination intensity, the second coherent illumination intensity, and the third coherent illumination intensity is below a predetermined threshold;
selecting the trail anti reflective layer thickness as the anti reflective layer thickness if the total coherent illumination intensity is below the predetermined threshold;
applying a photoresist layer over the anti reflective layer;
exposing and developing the photoresist to mask a masked portion of the anti reflective layer and to expose an unmasked portion;
etching the antireflective layer and the polysilicon layer in the unmasked portion.

10. The method of claim 9, wherein the first coherent illumination intensity is equal the intensity of coherent illumination incident on the interface between the photoresist layer and the anti reflective layer multiplied by a first reflection coefficient and phase shifted by Π radians, the first reflection coefficient being equal to the quotient of the difference between the absolute index of refraction of the photoresist layer and the absolute index of refraction of the anti reflection layer divided by the sum of the absolute index of refraction of the photoresist layer and the absolute index of refraction of the anti reflection layer.

11. The method of claim 10, wherein the second coherent illumination intensity is equal the intensity of coherent illumination incident on the interface between the photoresist layer and the anti reflective layer that is:

phase shifted by Π radians plus a phase equal to twice a phase shift that occurs by transmission through the anti reflective layer; and multiplied by:
a fraction of illumination transmitted through the anti reflective layer squared,
a first transmission coefficient squared, the transmission coefficient to being equal to the quotient of 4 multiplied by the absolute index of refraction of the photoresist layer multiplied by the absolute index of refraction of the anti reflection layer divided by the square of the sum of the absolute index of refraction of the photoresist layer and the absolute index of refraction of the anti reflection layer, and
a second reflection coefficient, the second reflection coefficient being equal to the quotient of the difference between the absolute index of refraction of the anti reflection layer and the absolute index of refraction of the polysilicon layer divided by the sum of the absolute index of refraction of the anti reflection layer and the absolute index of refraction of the polysilicon layer.

12. The method of claim 11, wherein the third coherent illumination intensity is equal the intensity of coherent illumination incident on the interface between the photoresist layer and the anti reflective layer that is:

phase shifted by Π radians plus a phase equal to twice a phase shift that occurs by transmission through the anti reflective layer plus twice a phase shift that occurs by transmission through the silicon gate layer; and multiplied by:
- a fraction of illumination transmitted through the anti reflective layer squared,
- a fraction of illumination transmitted through the silicon gate layer squared,
- the first transmission coefficient squared,
- a second transmission coefficient squared, the second transmission coefficient being equal to the quotient of 4 multiplied by the absolute index of refraction of the anti reflection layer multiplied by the absolute index of refraction of the silicon gate layer divided by the square of the sum of the absolute index of refraction of the anti reflection layer and the absolute index of refraction of the silicon gate layer, and
- a third reflection coefficient, the third reflection coefficient being equal to the quotient of the difference between the absolute index of refraction of the silicon gate layer and the absolute index of refraction of the high K dielectric divided by the sum of the absolute index of refraction of the silicon gate layer and the absolute index of refraction of the high K dielectric.

13. The method of claim 9, wherein determining the thickness of the anti reflective layer further includes:

determining a fourth coherent illumination intensity reflected from an interface between the high K dielectric layer and a base substrate below the high K dielectric layer; and wherein the total coherent illumination intensity comprises the sum of the first coherent illumination intensity, the second coherent illumination intensity, the third coherent illumination intensity, and the fourth coherent illumination intensity.

14. The method of claim 13, wherein the first coherent illumination intensity is equal the intensity of coherent illumination incident on the interface between the photoresist layer and the anti reflective layer multiplied by a first reflection coefficient and phase shifted by Π radians, the first reflection coefficient being equal to the quotient of the difference between the absolute index of refraction of the photoresist layer and the absolute index of refraction of the anti reflection layer divided by the sum of the absolute index of refraction of the photoresist layer and the absolute index of refraction of the anti reflection layer.

15. The method of claim 14, wherein the second coherent illumination intensity is equal the intensity of coherent illumination incident on the interface between the photoresist layer and the anti reflective layer that is:

phase shifted by Π radians plus a phase equal to twice a phase shift that occurs by transmission through the anti reflective layer; and multiplied by:
- a fraction of illumination transmitted through the anti reflective layer squared,
- a first transmission coefficient squared, the transmission coefficient being equal to the quotient of 4 multiplied by the absolute index of refraction of the photoresist layer multiplied by the absolute index of refraction of the anti reflection layer divided by the square of the sum of the absolute index of refraction of the photoresist layer and the absolute index of refraction of the anti reflection layer, and
- a second reflection coefficient, the second reflection coefficient being equal to the quotient of the difference between the absolute index of refraction of the anti reflection layer and the absolute index of refraction of the polysilicon layer divided by the sum of the absolute index of refraction of the anti reflection layer and the absolute index of refraction of the polysilicon layer.

16. The method of claim 15, wherein the third coherent illumination intensity is equal the intensity of coherent illumination incident on the interface between the photoresist layer and the anti reflective layer that is:

phase shifted by Π radians plus a phase equal to twice a phase shift that occurs by transmission through the anti reflective layer plus twice a phase shift that occurs by transmission through the silicon gate layer; and multiplied by:
- a fraction of illumination transmitted through the anti reflective layer squared,
- a fraction of illumination transmitted through the silicon gate layer squared,
- the first transmission coefficient squared,
- a second transmission coefficient squared, the second transmission coefficient being equal to the quotient of 4 multiplied by the absolute index of refraction of the anti reflection layer multiplied by the absolute index of refraction of the silicon gate layer divided by the square of the sum of the absolute index of refraction of the anti reflection layer and the absolute index of refraction of the silicon gate layer, and
- a third reflection coefficient, the third reflection coefficient being equal to the quotient of the difference between the absolute index of refraction of the silicon gate layer and the absolute index of refraction of the high K dielectric divided by the sum of the absolute index of refraction of the silicon gate layer and the absolute index of refraction of the high K dielectric.

* * * * *